US008219342B2

(12) United States Patent
Medardoni et al.

(10) Patent No.: US 8,219,342 B2
(45) Date of Patent: Jul. 10, 2012

(54) VARIATION TOLERANT NETWORK ON CHIP (NOC) WITH SELF-CALIBRATING LINKS

(75) Inventors: Simone Medardoni, Rovigo (IT); Marcello Lajolo, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 924 days.

(21) Appl. No.: 12/198,986

(22) Filed: Aug. 27, 2008

(65) Prior Publication Data

US 2009/0210184 A1 Aug. 20, 2009

Related U.S. Application Data

(60) Provisional application No. 60/973,185, filed on Sep. 18, 2007.

(51) Int. Cl.
*G01R 35/00* (2006.01)
(52) U.S. Cl. ........... 702/89; 702/64; 702/69; 702/78; 702/79; 327/156; 327/157; 327/175; 327/199; 327/276; 331/34; 331/57
(58) Field of Classification Search ............ 702/64, 702/69, 78, 79, 89; 327/156, 157, 175, 199, 327/276; 331/34, 57
See application file for complete search history.

(56) References Cited

U.S. PATENT DOCUMENTS

2008/0129341 A1* 6/2008 Mochizuki ............ 326/86

FOREIGN PATENT DOCUMENTS

JP 2006-326339 * 12/2006

OTHER PUBLICATIONS

F. Worm, P. Ienne, P. Thiran, and G. D. Micheli, "A Robust Self-Calibrating Transmission Scheme for On-Chip Networks ," in *IEEE transactions on very large scale integration (VLSI) system*,vol. 13,No. 1, Jan. 2005.
F. Worm, P. Ienne, P. Thiran, and G. D. Micheli, "An Adaptive Low Power Transmission Scheme for On-Chip Networks ," in *Proceedings of the 15th International Symposium on System Synthesis*, pp. 92-100, Oct. 2002.
S. Murali, R. Tambankar, F. Angiolini, A. Pullini, D. Atienza, L. Benini, and G. D. Micheli, "Comparison of a Timing-Error Tolerant Scheme with a Traditional Re-transmission Mechanism for Networks on Chips," in *Proc. of Int'l Symp. on Systems-on-Chip*, pp. 1-4, Nov. 2006.
A. Tiwari, S. R. Smruti, and J. Torrellas, "ReCycle: Pipeline Adaptation to Tolerate Process Variation," in *Proc. ofthe 34nd Int'l Symp. on Computer Architecture (ISCA '07)*, Jun. 2007.
F. Worm, P. Thiran, and P. Ienne, "Optimizing Checking-Logic for Reliability-Agnostic Control ofSelf-Calibrating Designs," in *Proc. Of the 8th Int'l Symp. on Quality Electronic Design (ISQED'07)*, 2007.
D. E. et aI., "Razor: A Low-Power Pipeline Based on Circuit-Level Timing Speculation," in *Proc. 36th Int'l Symp. Micro-architecture (Micro-36)*, pp. 7-18, 2003.

\* cited by examiner

*Primary Examiner* — Sujoy Kundu
(74) *Attorney, Agent, or Firm* — Bao Tran; Joseph Kolodka

(57) ABSTRACT

A self correcting device includes a first flip-flop to receive data and coupled to a clock input; one or more delayed flip-flops used to detect delay variations; a multiplexer coupled to the output of the first flip-flop and the delayed flip-flops, a metastability detector and error check controller to control the multiplexer to select one flip-flop output; and an adaptive voltage swing link coupled to the multiplexer output to generate a voltage swing on the link based on a selected clock skew.

17 Claims, 5 Drawing Sheets

VARIATION TOLERANT NETWORK ON CHIP (NOC) WITH SELF-CALIBRATING LINKS

The present application claims priority to Provisional Application Ser. No. 60/973,185 filed Sep. 18, 2007, the content of which is incorporated by reference.

BACKGROUND

The present invention relates to variation tolerant NoC systems.

Network-on-Chip (NoC) is an emerging paradigm for communications within large VLSI systems implemented on a single silicon chip. In a NoC system, modules such as processor cores, memories and specialized IP blocks exchange data using a network as a communication medium for the global information traffic. An NoC is constructed from multiple point-to-point data links interconnected by switches, such that messages can be relayed from any source module to any destination module over several links, by making routing decisions at the switches.

In a parallel trend, due to silicon technology scaling effects, boosting clock frequency of monolithic high-performance microprocessors has clearly reached a point of diminishing returns. As an effect, semiconductor devices are shifting towards massively parallel architectures with tens or even hundreds of cores integrated onto a single chip. With the increasing number of cores, scalability of communication architectures becomes critical for system performance and traditional bus architectures are not keeping up.

As transistor dimensions continue to shrink, it becomes harder and harder to precisely control the fabrication process. Transistors and wires become faster, but less predictable and, after fabrication, it is becoming more and more difficult to guarantee timing closure, and hence performance, across multiple copies of the chip. With traditional worst-case design techniques, the risk is to be too conservative or to discard too many chips, thus resulting in very low levels of yield. The emerging issue now is how to design differently than worst-case analysis.

Self-calibrating designs have been introduced as an alternative to worst-case characterization of silicon. Instead of relying on over-conservative worst-case assumptions, self-calibrating circuits tune their operating parameters to in-situ actual conditions. A run-time controller receives feedback from a checker that monitors correct operation of the circuit. When needed, circuit reliability can be restored at some power or performance cost, depending on actual silicon capabilities and noise conditions.

Self-calibrating links in the context of on-chip networks has been proposed where dynamic voltage swing scaling is used to dynamically adapt to environmental variations, design uncertainties, manufacturing parameter deviations or communication bandwidth requirements. While this transmission scheme adapts to variations of link physical parameters by discovering the real delay-voltage characteristic of the technology without any assumptions on it, there is no connection between link operating conditions and parameter variations affecting upstream or downstream functional units. In practice, self-calibrating links cannot prevent an upstream switch from violating its timing requirements due to delay variations.

SUMMARY

In one aspect, a self correcting device includes a first flip-flop to receive data and coupled to a clock input; one or more delayed flip-flops used to detect delay variations; a multiplexer coupled to the output of the first flip-flop and the delayed flip-flops, a metastability detector and error check controller to control the multiplexer to select one flip-flop output; and an adaptive voltage swing link coupled to the multiplexer output to generate a voltage swing on the link based on a selected clock skew.

In another aspect, a method for operating a self-correcting device including a flip-flop to receive data input and a clock input; a detection and correction unit; a multiplexer coupled to the output of the flip-flop and the detection and correction unit, and a metastability detector and error check controller to control the multiplexer, the method includes performing post-fabrication testing of the self-correcting device; calibrating the self-correcting device; selecting a path through the flip-flop and the detection and correction unit that compensates for delay variations; and operating the self-correcting device after calibration.

In yet another aspect, a system includes a network-on-chip (NoC) device having a plurality of sub-units; and a variation tolerant switch-to-switch link coupling the sub-units, wherein the link automatically detects delay variations and compensates for the delay variations.

The variation tolerant switch-to-switch link in a NoC tolerates the effects of process variations on NoC architectures using self-correcting links that automatically detect delay variations and compensate them. The correction is applied without increasing the switch-to-switch latency by substituting the output flip-flops of the sending switch with a self-correcting flip-flop followed by an adaptive voltage swing selector. Higher delay variations will result in a smaller slack in the switch-to-switch path, but the adaptive voltage swing selector could mitigate its impact on the NoC communication by increasing the voltage swing on the link, thus allowing a compensation of the delay variation. As a result, the system can tolerate delay variations at the cost of additional power consumption.

DESCRIPTION

Figure 1A:
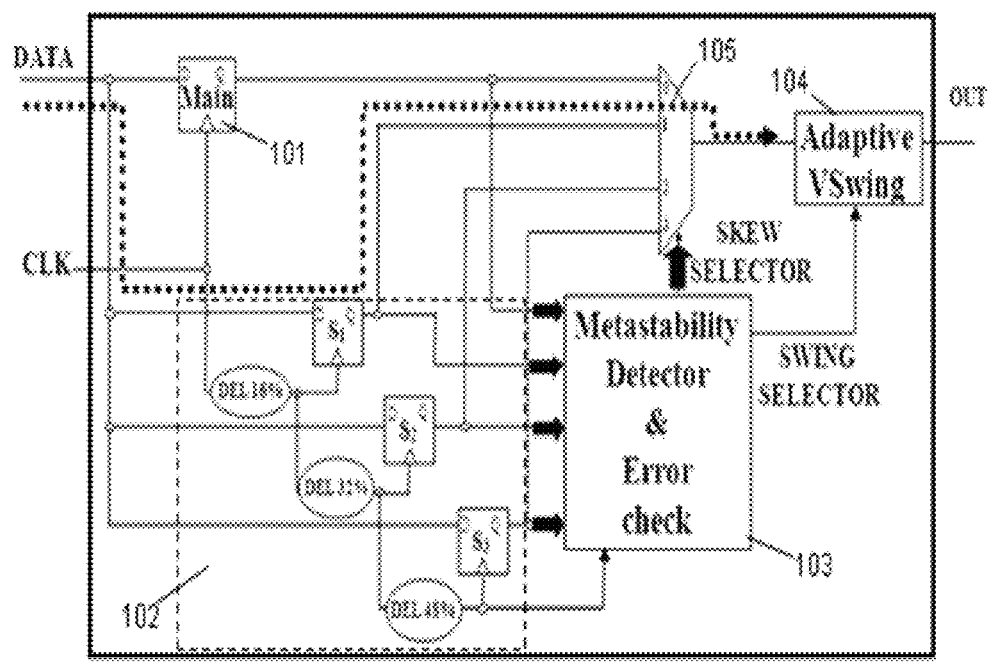
FIGS. 1A-1B shows a self-calibrating circuit that empowers a selected subset of standard flip-flops with error detection and correction capabilities.
Figure 1B:
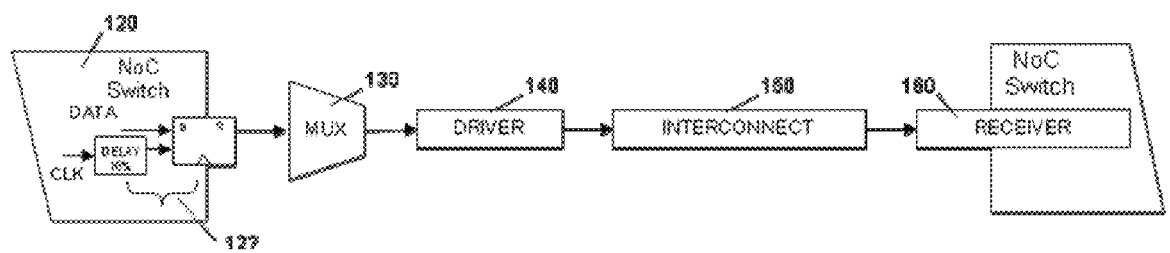

FIGS. 1A-1B shows a self-calibrating circuit that empowers a selected subset of standard flip-flops (FFs) with error detection and correction capabilities. FIG. 1A shows the architecture of a self-correcting FF that recycles switch-link pipelines in on-chip networks. In FIG. 1A, data is received by a main FF 101 as well as by a plurality of detection and correction paths 102. The detection and correction paths 102 in turn are made of one or more FFs, each receiving the same input data and a delayed version of the clock. In the embodiment of FIG. 1A, three paths 102 are provided, one delayed by 16%, one delayed by 32% and one delayed by 48%. If the incoming data, due to process variations, arrives late, the main FF will sample it incorrectly, but the circuit is equipped with a certain number of additional detection and correction paths 102 that will be able to tolerate delays up to approximately 50% of the clock period. The outputs of the FFs 101 and the FFs in the paths 102 are provided to a metastability detector and error check controller 103. As multiple delayed FFs sample the same input signal, the system of FIG. 1A is sensitive to metastability, and this is accounted for in the controller 103.

In one embodiment, the controller 103 compares all FF outputs (MAIN, S1, S2) with that of S3. When the output of an FF 101 or 102 differs from S3 or is metastable, then the next one in the timing chain is selected for reliable operation. If there are no evidences of process variations, the controller 103 selects the data from the main FF 101. The truth table of the controller is reported in Table 1 as follows:

TABLE 1

Truth table of the operating point controller.

| S2 | S1 | MAIN | SELECTED FF | Sel1 | Sel2 |
|---|---|---|---|---|---|
| 0 | 0 | 0 | MAIN | 0 | 0 |
| 0 | 0 | 1 | S1 | 0 | 1 |
| 0 | 1 | 1 | S2 | 1 | 0 |
| 1 | 1 | 1 | S3 | 1 | 1 |

The controller 103 controls a multiplexer 105 which selects one of the FFs. The output of the mux 105 is provided to an adaptive swing voltage driver 104 to generate an output.

The enhanced FF of FIG. 1A needs not only to detect timing violations, but also to quantify them. The voltage swing on the link will have to be adjusted accordingly, but not over-designed to avoid link power inefficiencies.

The enhanced self-correcting FF has two execution modes, with well differentiated performance and power requirements: calibration mode and normal execution mode. In calibration mode, an operating point controller compares the output of the main and of the delayed-sampling flip flops, assuming that the worst-case transition delay of the input signal is within the correct sampling window of the flip flop with the most delayed clock. The information is collected and used to calibrate the enhanced self-correcting FF of FIG. 1A. After calibration, the circuit of FIG. 1A can be deployed.

Turning now to FIG. 1B, a self-correcting FF system is shown. In FIG. 1B, a self-correcting FF 120 includes a plurality of FFs 122 that sample delayed data. The outputs of the plurality of FFs 122 are selected by a multiplexer 130 and then presented to a driver 140. The signal is transmitted by an interconnect 150 and eventually delivered to a receiver 160.

Whenever the switch and the link can be viewed as two consecutive pipeline stages, a critical path delay degradation in the switch can be compensated through slack stealing from the link. If not enough slack is available in other pipeline stages, donor pipeline stages can be inserted, which are empty stages added in the pipeline to donate slack to the slow stages. Such slack could be provided without increasing link latency (e.g., by means of pipelined links). Link operating conditions provide the needed tuning knob to adapt the link propagation delay to the skew applied to an upstream logic stage. In particular, electrical schemes to reduce the voltage swing of the interconnect can be used as the variable voltage swing impacts the speed at which the interconnect driver is able to charge of discharge the load capacitance. In the past, this has been exploited to identify voltage/frequency pairs for reliable link operation in presence of changing environmental conditions or application requirements. The slack stealing technique to switch-link pipelines in on-chip networks can be used for process variation tolerant operation by skewing the clock of the switch output latches to compensate for variation induced gate delays.

The system makes up for the reduced margins for signal propagation across the link by increasing the voltage swing. Since the effects of process variations are typically known only during the post-silicon testing, a self-calibrating mechanism is provided in the link that tunes clock skews and drives the proper voltage swing to the link driver and receiver.

The self correcting FF can be used where the NoC architecture exposes the switch-link interface as a logic pipeline. Switches implementing input buffering or virtual output queuing can be made variation-tolerant provided output latching is implemented. In principle, this might lead to increased communication latency through the network, but a lack of output latching might give rise to long signal paths degrading global design performance. Circuit switching architectures are ideal candidates for the self-correcting FFs, since they implement end-to-end flow control and feature retiming stages at switch inputs and outputs. The technique applies to output-buffered switches as well with a few modifications. First, the input to output buffers should feed the enhanced FF as well. During self-calibration, the controller selects the proper voltage swing for the switch output links. Moreover, it should drive a multiplexer that selects a proper delayed version of the clock for the whole output buffer. Second, input latching may be required to break long timing paths.

Figure 2:
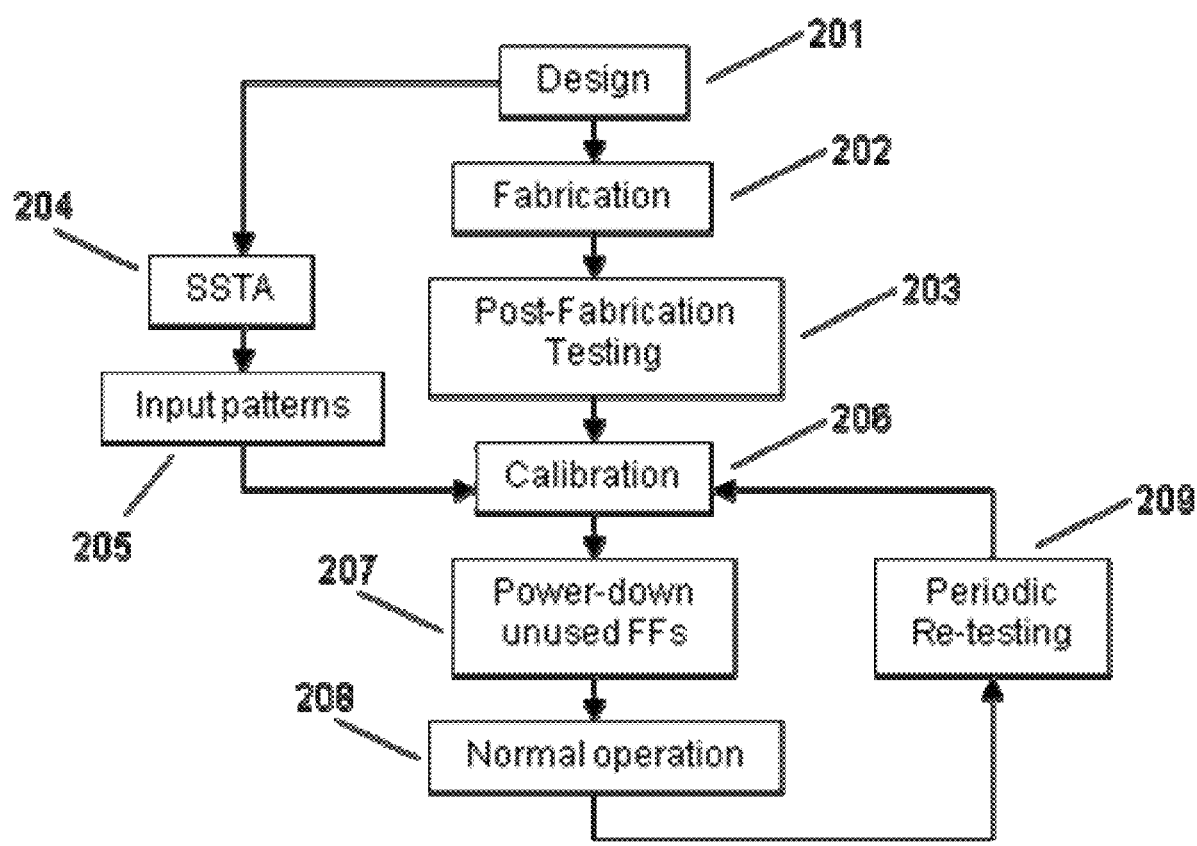
FIG. 2 shows an exemplary self-calibration process flow.

FIG. 2 shows an exemplary self-calibration process flow. First, a design is generated for a circuit (201). Next, the circuit is fabricated (202) and undergoes post-fabrication testing (203). A statistical static timing analysis (SSTA) is performed (204) and input patterns are fed to the SSTA for a test pattern selection process (205). The selected test pattern and the post-fab testing data are provided for calibration (206). After calibration, unused FFs are powered down (207). The device is then deployed for normal operation (208). Periodically, the device can be retested (209) and then calibrated (206).

The calibration phase 206 takes place during post-fabrication testing (203), and requires proper input patterns 205 to be fed to the switch. Switch critical paths need to be stimulated for proper detection of timing violations. As process variations paths that are non-critical under nominal conditions may become critical under certain variation scenarios, statistical static timing analysis (204) is used to drive the test pattern selection process. Switches are easily testable and they usually exhibit a well identifiable number of critical paths going through the arbitration stage and through the crossbar selection signals. Moreover, a large timing gap exists between the critical and the non-critical paths, thus making SSTA easier. After calibration, the circuit enters in its normal execution mode (208). All FFs that do not belong to the selected path can be powered down 207 using either clock- or power-gating techniques in order to save power.

Active circuits during both calibration and execution modes are illustrated in FIGS. 1A and 1B, respectively. No power overhead is caused by the self-calibrating link during normal execution mode. Periodically, the chip could be re-tested (209) and new problems caused by delay variations might arise depending on the age and the history of operating conditions of the chip. The NoC links could be reconfigured in order to cope with the new conditions, thus resulting in the possibility to extend the lifetime of the chip by re-characterizing the links and their power consumption. This results in the possibility to effectively cope with wear-out effects.

Figure 3:
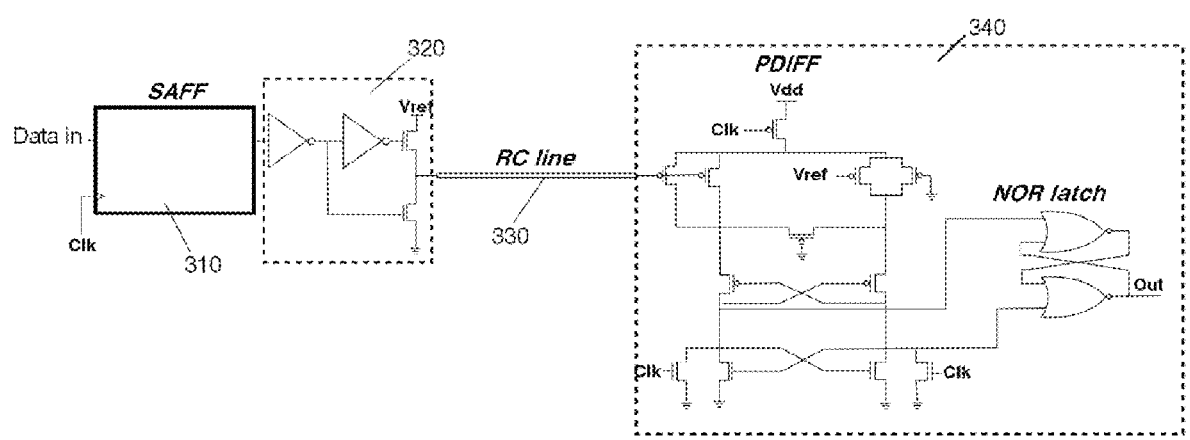
FIG. 3 shows an exemplary link design.

FIG. 3 shows an exemplary link design. Data is provided to a sense-amplifier-based flip-flop (SAFF) 310 which offers differential characteristics, fast operating speed, and low power consumption. The SAFF 310 incorporates a pre-charged sense amplifier followed by a symmetric latch topology that significantly reduces delay and improves driving capability. The SAFF 310 provides data to a transmitter 320 that drives the data signal across an interconnect 330 to a receiver 340. The transmitter 320 performs voltage-level conversion for low swing signaling. The receiver 340 is composed by an amplifier and an output latch. In this embodiment, the receiver 340 is a pseudo-differential circuit (PDIFF), consisting of a clocked sense amplifier and a static NOR output latch. The PDIFF receiver 340 uses single wire per bit while at the same time retaining most of the advantages of differential schemes, namely low input offset and good sensitivity. Its major reliability degradation comes from the local device mismatch between the double input transistor pair, which usually can be controlled very well. Since the SAFF 310 samples on the rising edge of the clock and the receiver 340 on the falling edge, the system can apply a clock signal with a phase shift between these two modules in order to increase the link throughput and/or to let the receiver 340 sample more stable input signals. In order to simplify the clock network, the PDIFF receiver 340 received a negated clock, thus giving the signal an entire clock period for propagation across the link.

Figure 4:
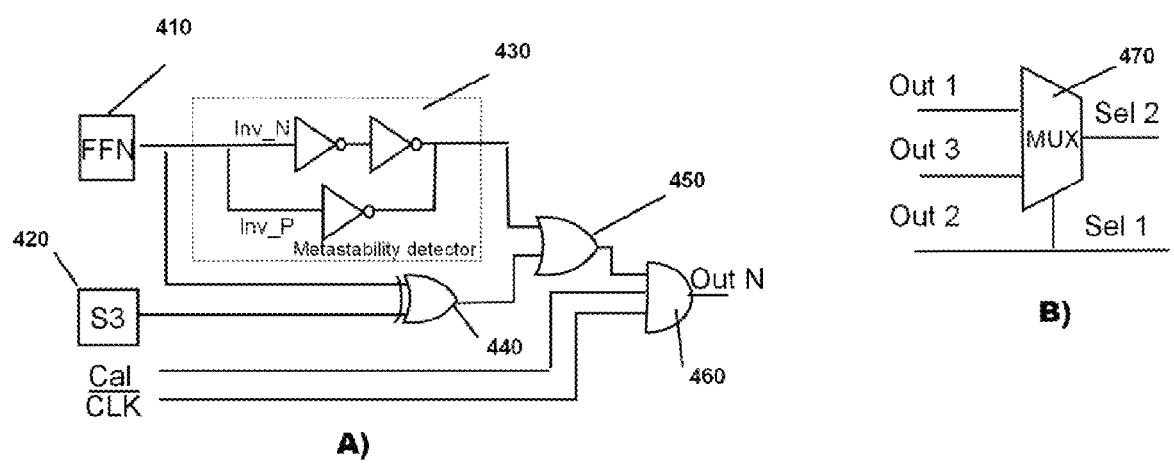
FIGS. 4A-4B show an exemplary controller.

FIGS. 4A-4B show an exemplary controller. In FIG. 4A, the output a generic FF 410 of index N (MAIN, S1, S2) is compared against that of the reliable S3 FF 420. At this stage, only 50% of the clock period is available for single cycle calibration, since the system has to wait for the sampling of S3 to have the reference logic value for comparison. The output of FF 410 is provided to a metastability detector 430 and then compared using an XOR 440, an OR gate 450 and an AND gate 460 that generates OUTN output. When values differ or metastability is detected, a logic 1 is generated on OUTN. All outputs at this stage then feed a combinational logic which returns the binary code of the selected FF. As illustrated in FIG. 4B, a multiplexer (mux) 470 implements the truth table of the combinational function from Table 1. OUT2 is not only the mux selector, but also the first digital output of the controller, the second being the mux output. A metastability detector 430 is also used to detect the presence of a metastable voltage level. A detected metastability event is corrected the same way as a regular delay failure. The circuit consists of two inverter gates with different skewed PIN ratios, such that they switch at different voltage levels. If the two inverters interpret the result differently, the flip flop voltage is not definitive and may be metastable. In this implementation, a complete system failure due to metastability cannot be completely avoided and only its probability of occurrence can be reduced to negligible levels. Various techniques known to those skilled in the art for a further reduction of the probability of metastability events can be applied.

Figure 5:
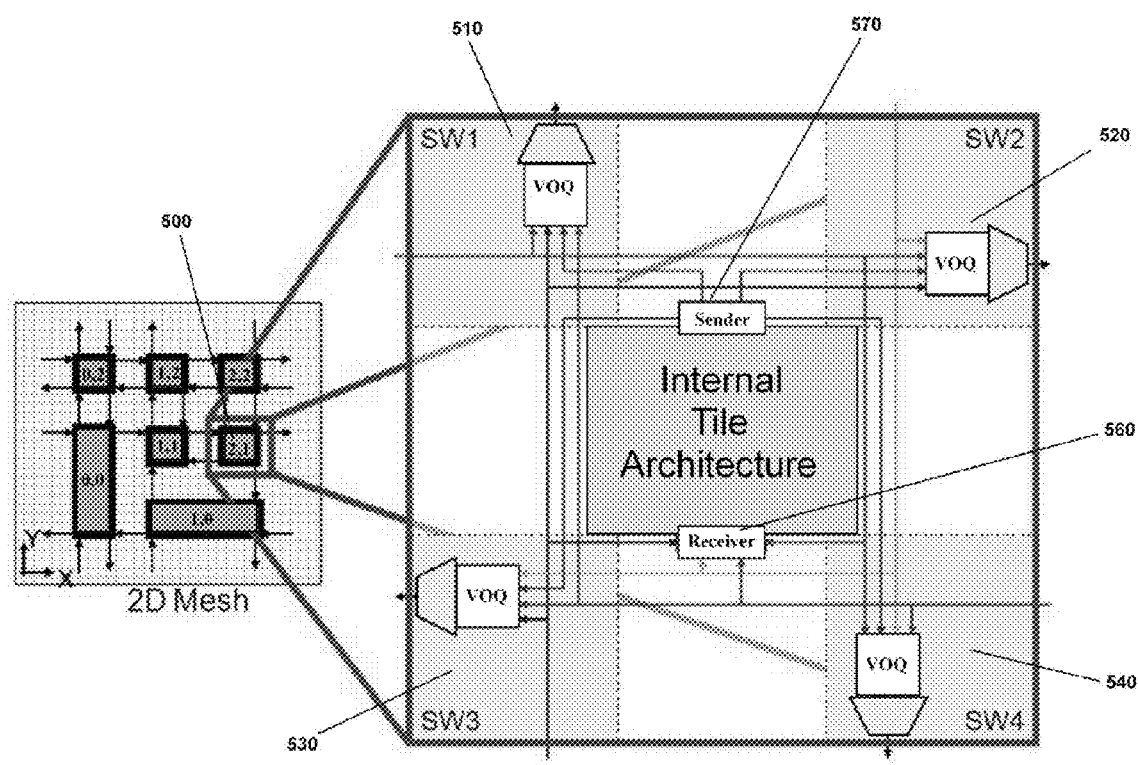
FIG. 5 shows an exemplary NoC architecture that works with the process variation compensation technique.

FIG. 5 shows an exemplary NoC architecture that works with the process variation compensation technique. The NoC architecture is a heterogeneous tile-based architecture where a two-dimensional fabric of tiles 500 is connected to form a mesh or torus architecture. Each tile 500 typically consists of one or more bus based subsystems 580 and each subsystem 580 can contain multiple IP cores (processors, memory modules and dedicated hardware components). The NoC tile wrapper provides access and isolation to each tile by routing and buffering messages between tiles. The tile wrapper is connected to four other neighboring tiles through input and output channels. A channel consists of two unidirectional point-to-point links between two tile wrappers. A tile wrapper has internal queues to handle congestion. Among the advantages of a tile-based distributed switch architecture with respect to a concentrated switch is that it naturally leads to a hierarchical design process in which every tile can operate at a different frequency and the introduction of different power rings in the layout and the insertion of DC-DC converters are easier. Moreover, each tile can be developed as a stand-alone block and the NoC can be created by connecting them as elements in the network.

In the embodiment of FIG. 5, there are four switches (SW1 to SW4) 510-540, a receiver 560 and a sender 570. Dedicated receiver and sender units 560-570 act as adaptation layers (network interfaces) between internal bus protocol and NoC protocol. In a wrapper, each of switches 510-540 has four outgoing connections: outside, straight, internal, across. Similarly, each switch has four incoming links. All switches are identical, with four input and four output ports and three internal components: an enqueuing module (EQ), internal memory (VOQ) and a dequeuing module (SF). The EQ module performs routing and enqueues packets in the queues of the virtual output queued switches. The enqueue operation performed by EQ takes one cycle. The output ports of the enqueuing module are latched and are therefore can use the self-calibrating technique. Their boundary acts like a logic pipeline: data is retimed and injected into the links.

In the NoC system of FIG. 5, each output flip flop of the EQ is replaced with the enhanced self-correcting FFs of FIG. 1A. This way, process variation induced delays that take place in the EQ combinational logic, in the upstream input link and in the switching fabric of the upstream tile wrapper can be potentially compensated in the EQ output links.

The variation tolerant version of a switch-to-switch link in a NoC provides a number of benefits, including tolerating the effects of process variations on NoC architectures using self-correcting links that automatically detect delay variations in upstream logic units and compensate them. The correction is applied without increasing the switch-to-switch latency by substituting the output flip-flops of the sending switch with a self-correcting flip-flop followed by an adaptive voltage swing selector. As a result, it is possible to tolerate delay variations at the cost of additional power consumption.

The system uses digital self-calibrating links to compensate process variation induced delays in the upstream logic unit. The communication channel is not viewed in isolation, but its operating parameters can be adapted to absorb and compensate the effects of process variations in connected modules. Link voltage swing is also used as a compensation knob. In one embodiment, a design methodology is disclosed where process variations of link upstream modules are measured during the post-fabrication test phase, and clock skew of such modules tuned accordingly. The system makes up for the reduced propagation delay margins on the link through voltage swing adaptation. The energy overhead induced by the increased swing is offset by deploying low-swing signaling on the links under nominal conditions. This creates some margin for power savings which is the budget for process variation compensation during post-silicon testing and therefore for yield enhancement. The technique can also be used during the normal life of the circuit in order to address wear-out problems. Periodically, the chip could be re-tested and new problems caused by delay variations might arise. The NoC links could be reconfigured in order to cope with the new conditions, thus resulting in the possibility to extend the lifetime of the chip by re-characterizing the links and their power consumption.

The invention may be implemented in hardware, firmware or software, or a combination of the three. Preferably the invention is implemented in a computer program executed on a programmable computer having a processor, a data storage system, volatile and non-volatile memory and/or storage elements, at least one input device and at least one output device.

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A self correcting device, comprising:
   a. a first flip-flop to receive data and coupled to a clock input;
   b. one or more delayed flip-flops used to detect delay variations;
   c. a multiplexer coupled to the output of the first flip-flop and the delayed flip-flops,
   d. a metastability detector and error check controller to control the multiplexer to select one flip-flop output; and
   e. an adaptive voltage swing link coupled to the multiplexer output to generate a voltage swing on the link based on a selected clock skew.

2. The device of claim 1, wherein each delayed flip-flop receives the data input and a delayed version of the clock input.

3. The device of claim 1, wherein the controller selects data from the first flip-flop if there is no process variation.

4. The device of claim 1, wherein the flip-flops form a timing chain and wherein the controller compares all flip-flop outputs with the output of the most delayed flip-flop and when the output of a flip-flop differs or is metastable, the next flip-flop output in the timing chain is selected for reliable operation.

5. The device of claim 1, comprising a swing voltage driver coupled to a multiplexer output.

6. The device of claim 5, wherein the swing voltage driver is adaptive.

7. The device of claim 5, wherein the swing voltage driver comprises a sense-amplifier-based flip-flop (SAFF).

8. The device of claim 5, comprising a receiver coupled to the swing voltage driver.

9. The device of claim 8, wherein the receiver comprises a pseudo-differential circuit (PDIFF).

10. A method for operating a self-correcting device including a flip-flop to receive data input and a clock input; a detection and correction unit; a multiplexer coupled to the output of the flip-flop and the detection and correction unit, and a metastability detector and error check controller to control the multiplexer, the method comprising:
    a. performing post-fabrication testing of the self-correcting device;
    b. calibrating the self-correcting device;
    c. selecting a path through the flip-flop and the detection and correction unit that compensates for delay variations; and
    d. operating the self-correcting device after calibration.

11. The method of claim 10, comprising periodically re-calibrating the device.

12. The method of claim 11, comprising providing input patterns to a statistical static timing analysis (SSTA).

13. The method of claim 11, comprising powering down components that do not belong to the selected path to save power.

14. The method of claim 11, comprising powering down unused flip-flops in the device.

15. A system, comprising:
    a. a network-on-chip (NoC) device having a plurality of sub-units; and
    b. a variation tolerant switch-to-switch link coupling the sub-units, wherein the link automatically detects delay variations and compensates for the delay variations;
    wherein the link comprises a self-correcting device, said self-correcting device comprising:
    i. a first flip-flop to receive data and coupled to a clock input;
    ii. one or more delayed flip-flops used to detect delay variations;
    iii. a multiplexer coupled to the output of the first flip-flop and the delayed flip-flops,
    iv. a metastability detector and error check controller to control the multiplexer to select one flip-flop output; and
    v. an adaptive voltage swing link coupled to the multiplexer output to generate a voltage swing on the link based on a selected clock skew.

16. The system of claim 15, comprising a tester to perform post-fabrication testing of the self-correcting device;
    calibrate the self-correcting device; and
    select a path through a pool of flip-flops to compensate for delay variations.

17. The system of claim 16, wherein the tester does one of: periodically recalibrates the self-correcting device, powers down unused flip-flops in the self-correcting device and performs statistical static timing analysis (SSTA).

* * * * *